United States Patent
Kang et al.

(10) Patent No.: US 12,262,552 B2
(45) Date of Patent: Mar. 25, 2025

(54) SOURCE/DRAIN EPITAXY PROCESS IN STACKED FET

(71) Applicant: INTERNATIONAL BUSINESS MACHINES CORPORATION, Armonk, NY (US)

(72) Inventors: Tsung-Sheng Kang, Ballston Lake, NY (US); Daniel Schmidt, Niskayuna, NY (US); Alexander Reznicek, Troy, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 516 days.

(21) Appl. No.: 17/814,248

(22) Filed: Jul. 22, 2022

(65) Prior Publication Data

US 2024/0030284 A1     Jan. 25, 2024

(51) Int. Cl.
| | |
|---|---|
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC ......... *H10D 62/118* (2025.01); *H10D 64/018* (2025.01); *H10D 84/0167* (2025.01); *H10D 84/017* (2025.01); *H10D 84/038* (2025.01); *H10D 84/856* (2025.01)

(58) Field of Classification Search
CPC ............... H10D 62/118; H10D 64/018; H10D 84/0167; H10D 84/017; H10D 84/856; H10D 64/017; H10D 30/014; H10D 30/43; H10D 64/015; H10D 64/021; H10D 62/121; H10D 84/0151; H10D 84/83; H10D 88/00; H10D 84/0128; H10D 84/0147; H10D 88/01
See application file for complete search history.

(56) References Cited

U.S. PATENT DOCUMENTS

| | | | |
|---|---|---|---|
| 9,954,058 B1 * | 4/2018 | Mochizuki | ........... H10D 62/121 |
| 10,014,390 B1 | 7/2018 | Bouche | |
| 10,236,217 B1 | 3/2019 | Ando | |
| 10,453,850 B2 | 10/2019 | Smith | |

(Continued)

FOREIGN PATENT DOCUMENTS

TW     I731138 B     6/2021

*Primary Examiner* — Karen Kusumakar
*Assistant Examiner* — Adam S Bowen
(74) *Attorney, Agent, or Firm* — Yuanmin Cai

(57) ABSTRACT

Embodiments of present invention provide a method of forming a semiconductor structure. The method includes forming a first set of nanosheets and a second set of nanosheets on top of the first set of nanosheets, wherein the first set of nanosheets has an uppermost nanosheet and the second set of nanosheets has a lowermost nanosheet, the lowermost nanosheet being separated from the uppermost nanosheet by a first gap; forming a conformal liner covering the first set of nanosheets and the first gap; covering a first portion of the conformal liner at the first gap with a protective stud; selectively removing a second portion of the conformal liner from end surfaces of the first set of nanosheets; and forming source/drain at the end surfaces of the first set of nanosheets. A structure formed thereby is also provided.

20 Claims, 14 Drawing Sheets

(56) References Cited

U.S. PATENT DOCUMENTS

| | | |
|---|---|---|
| 11,037,905 B2 | 6/2021 | Wu |
| 11,069,684 B1 | 7/2021 | Xie |
| 11,081,546 B2 | 8/2021 | Li |
| 11,158,544 B2 | 10/2021 | Cheng |
| 2019/0131394 A1* | 5/2019 | Reznicek ........... H10D 30/6739 |
| 2020/0235134 A1 | 7/2020 | Lilak |
| 2020/0294969 A1 | 9/2020 | Rachmady |
| 2020/0328127 A1 | 10/2020 | Yamashita |
| 2021/0349691 A1 | 11/2021 | Hekmatshoartabari |
| 2022/0320309 A1* | 10/2022 | Chen .................... H10D 62/021 |
| 2022/0328648 A1* | 10/2022 | Wong ................... H10D 64/018 |
| 2023/0120551 A1* | 4/2023 | Lee .................... H10D 30/6735 |
| | | 257/351 |

* cited by examiner

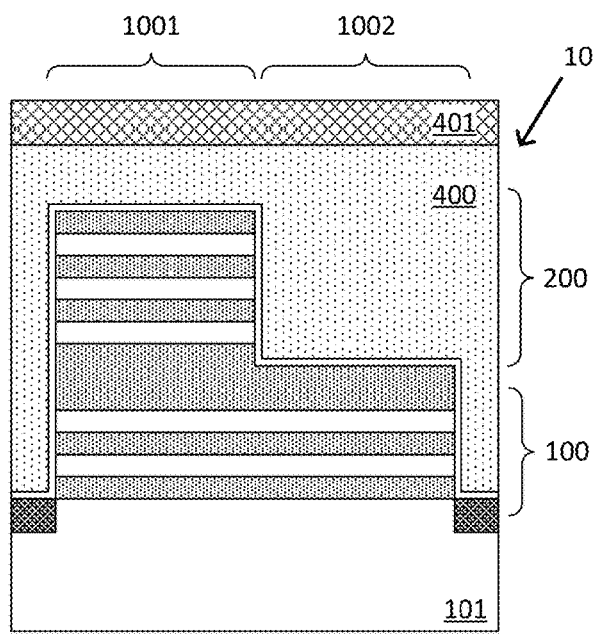
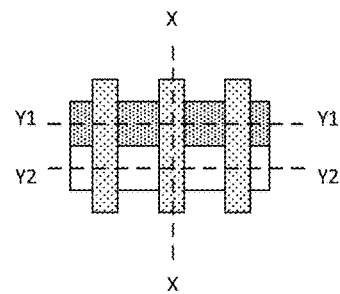
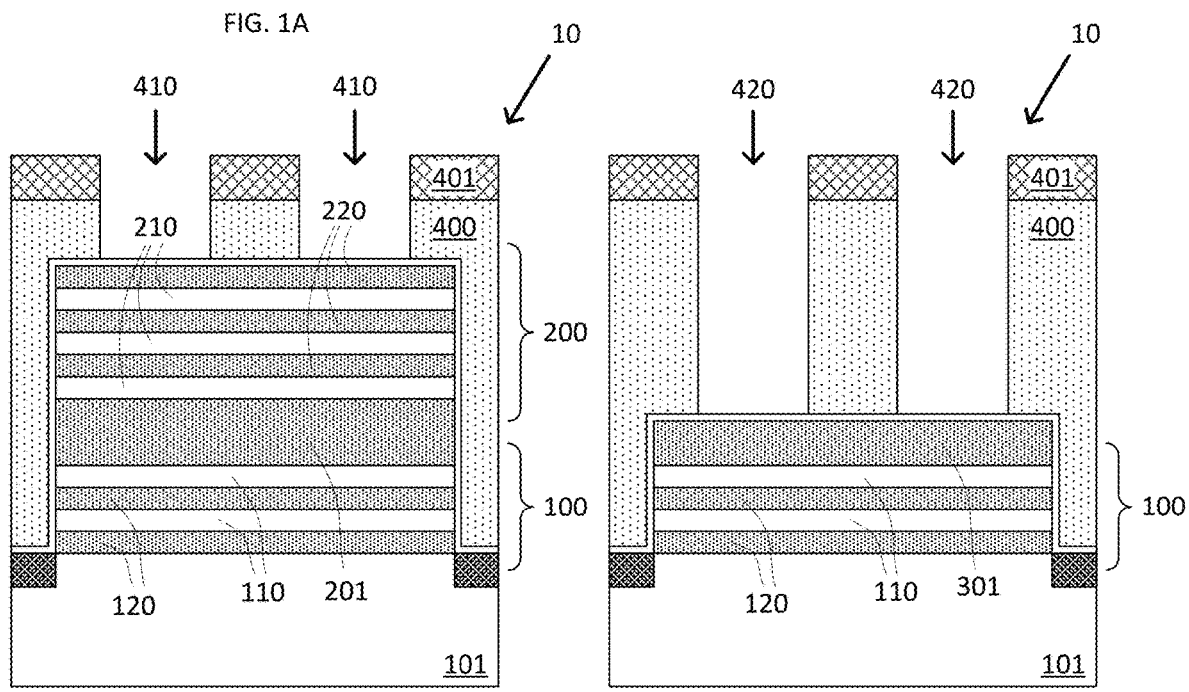
FIG. 1A
FIG. 1B
FIG. 1C

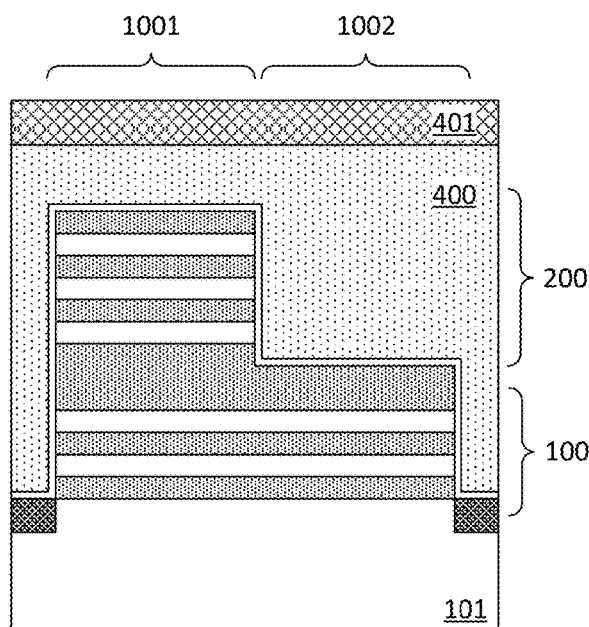
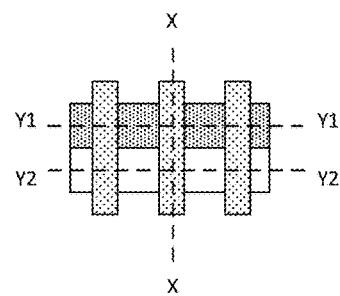
FIG. 2A
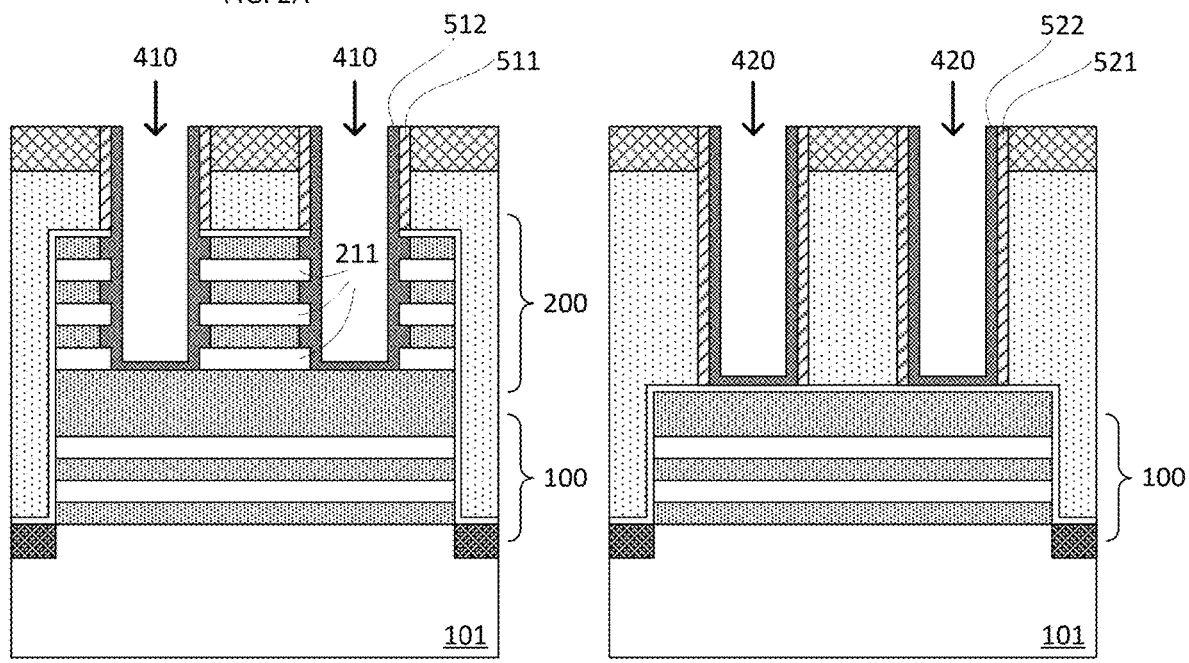
FIG. 2B  FIG. 2C

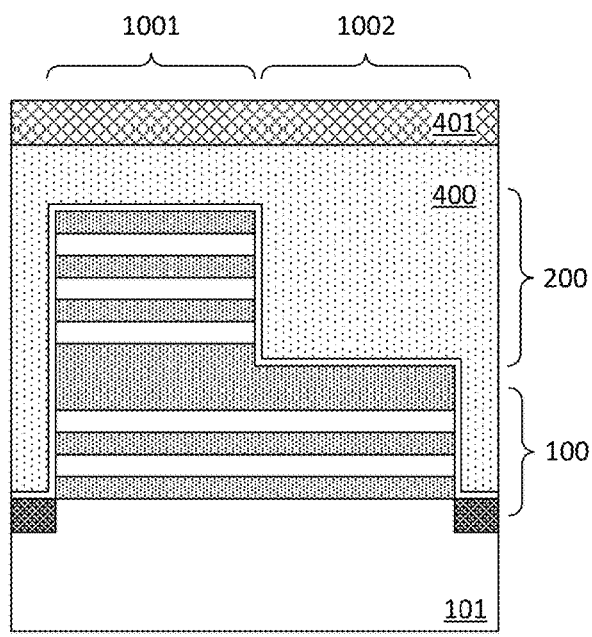
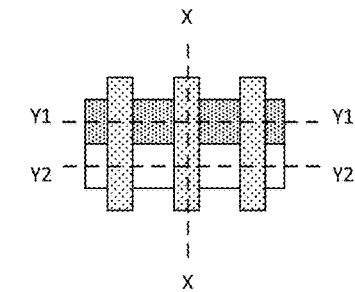
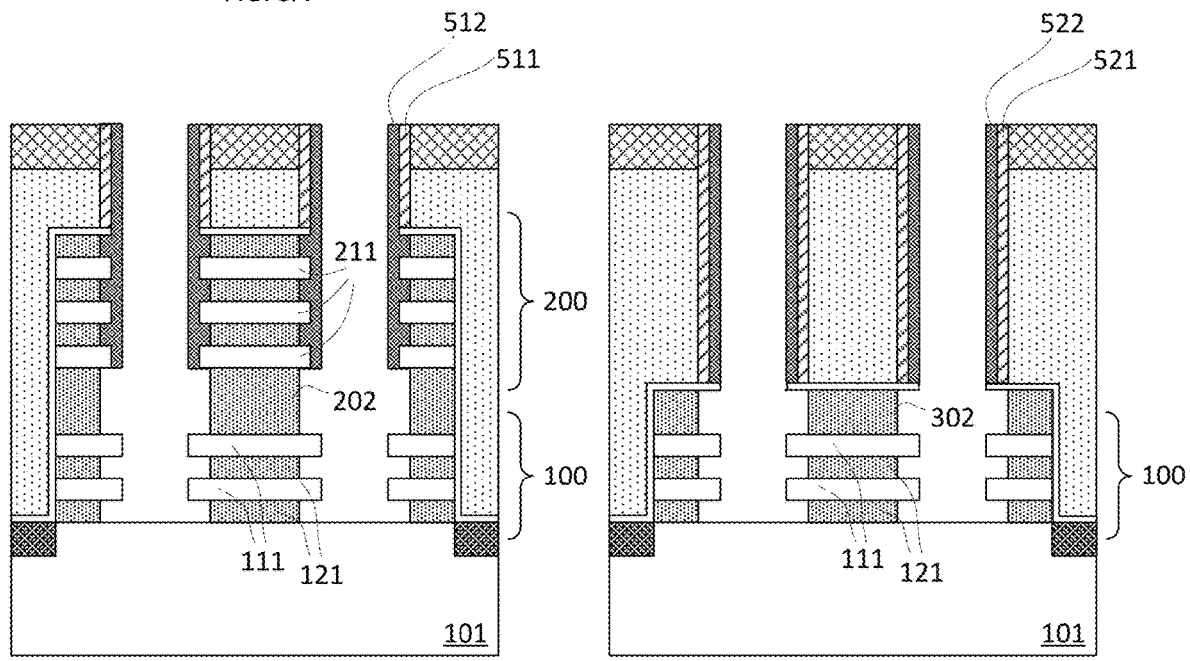
FIG. 3A
FIG. 3B
FIG. 3C

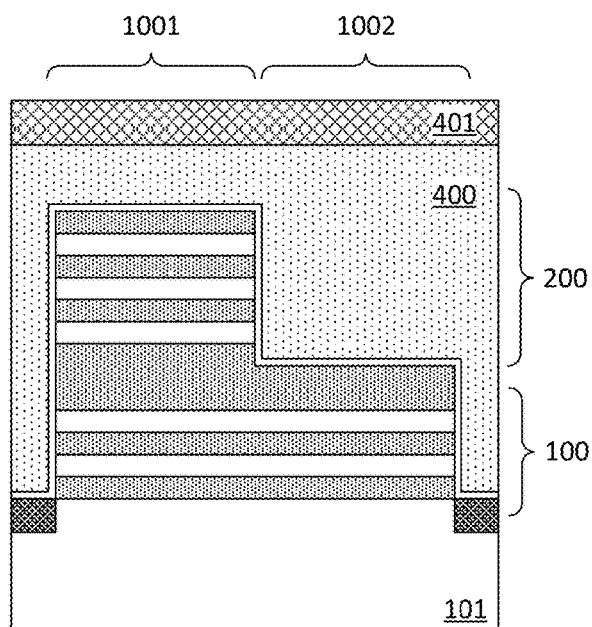
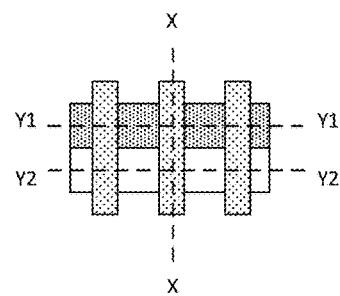
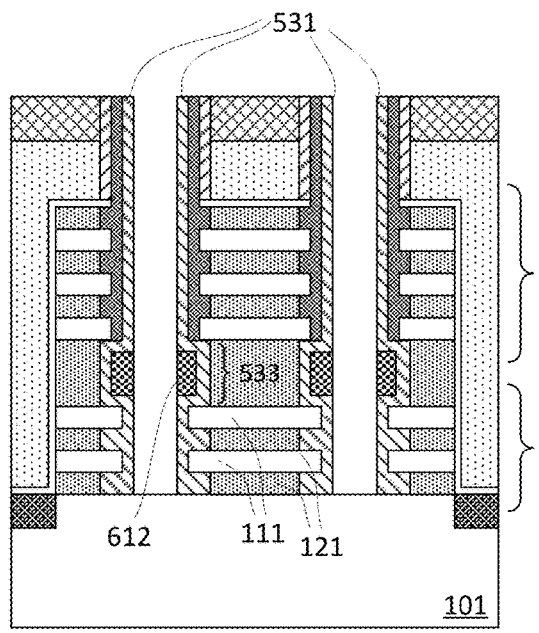
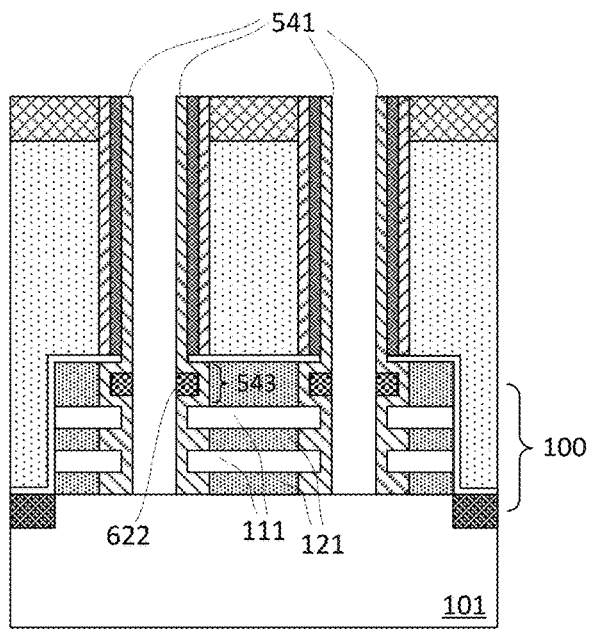
FIG. 7A
FIG. 7B
FIG. 7C

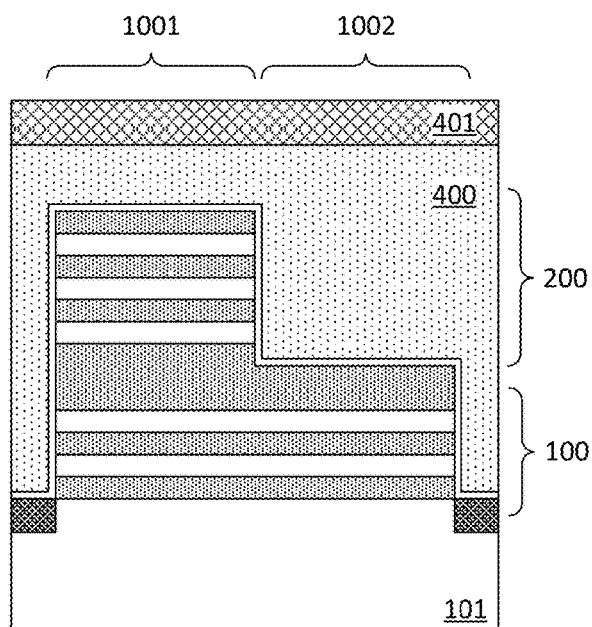
FIG. 8A
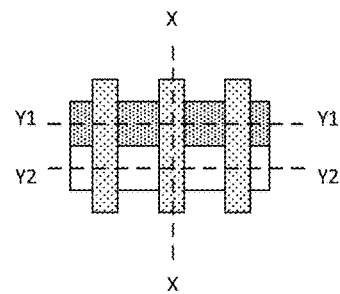
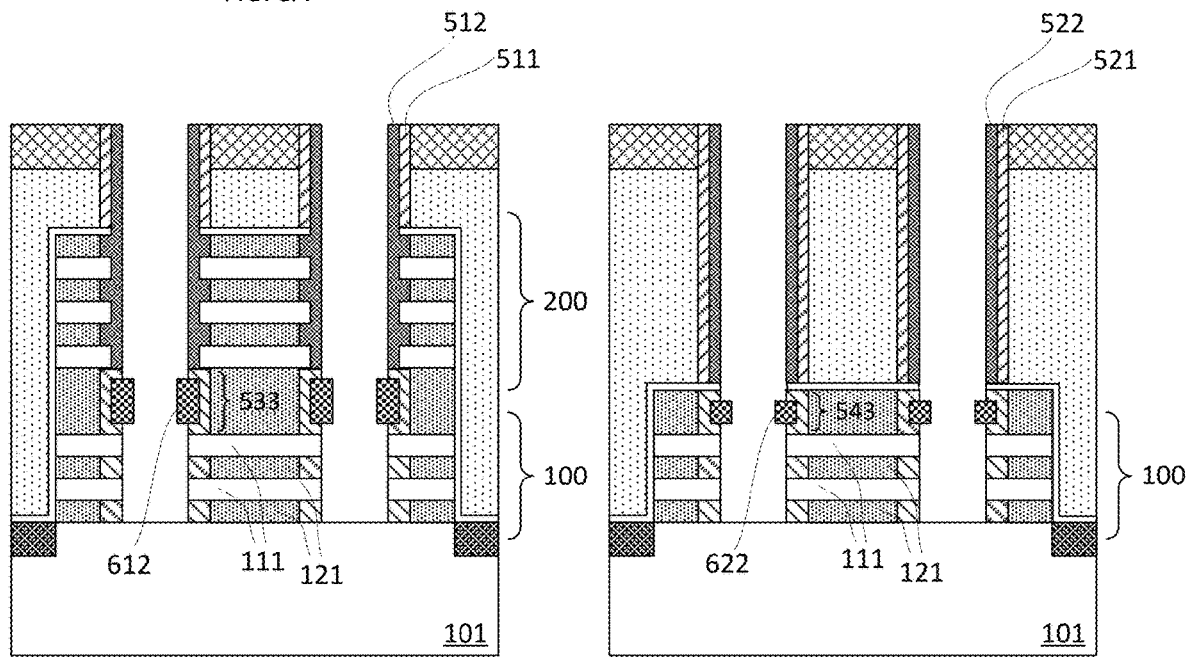
FIG. 8B
FIG. 8C

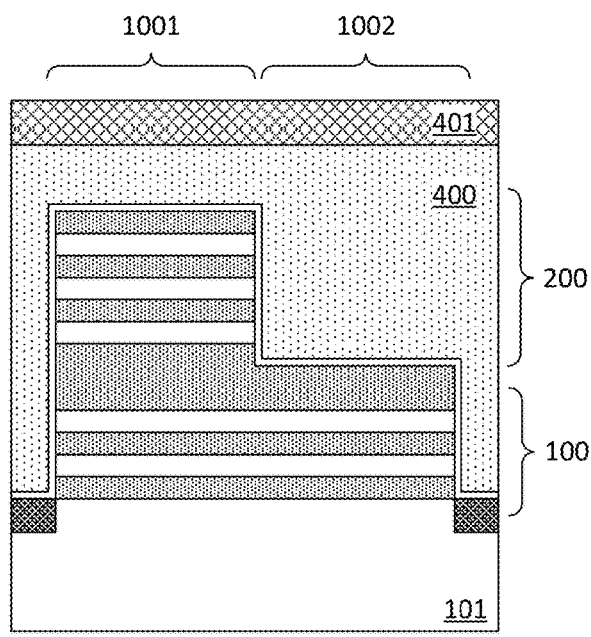
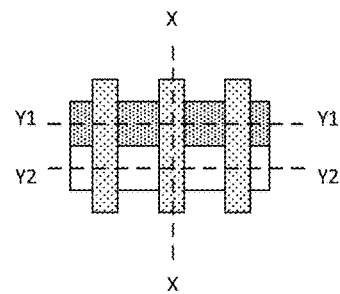
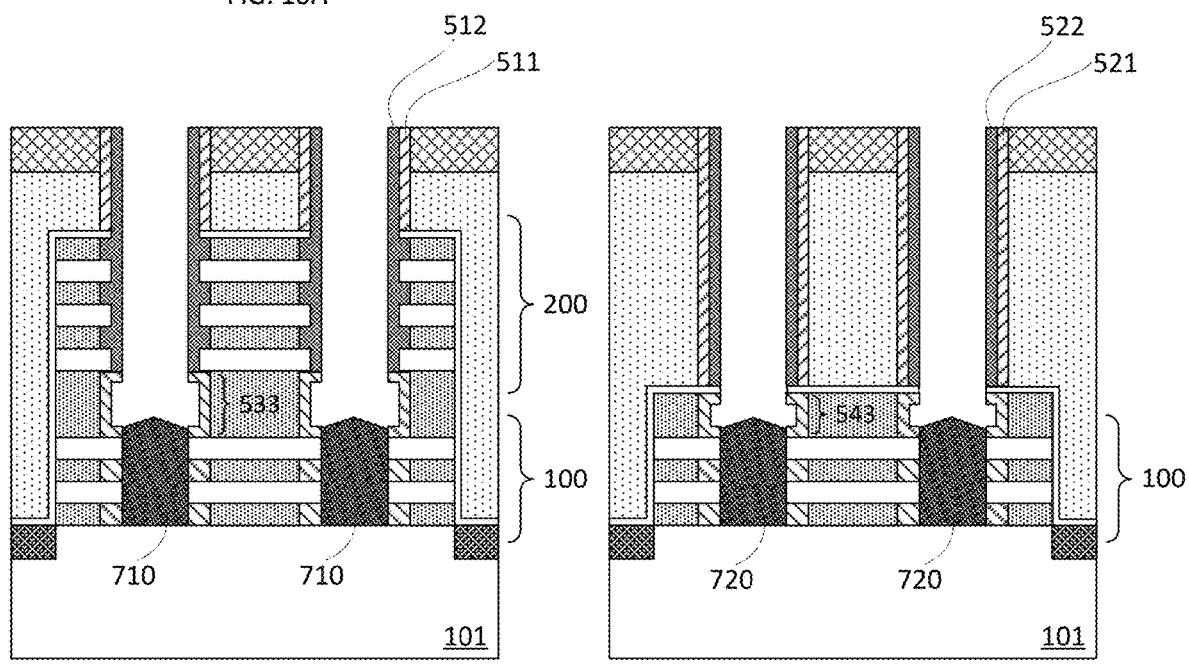
FIG. 10A
FIG. 10B
FIG. 10C

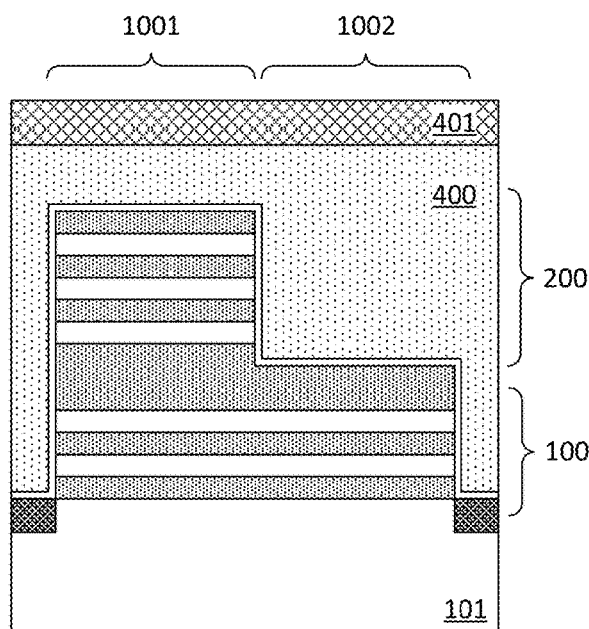
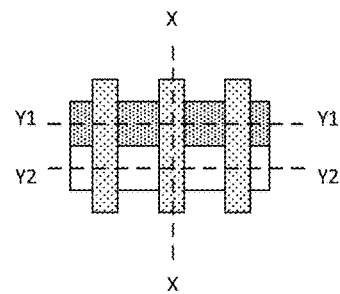
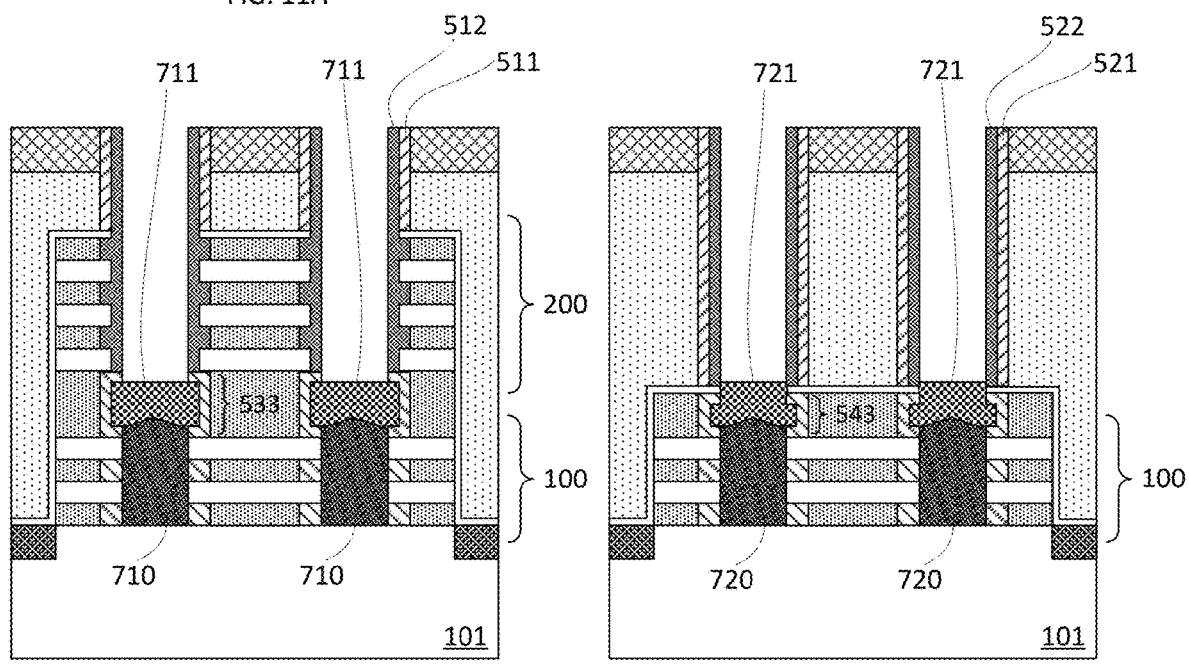
FIG. 11A
FIG. 11B
FIG. 11C

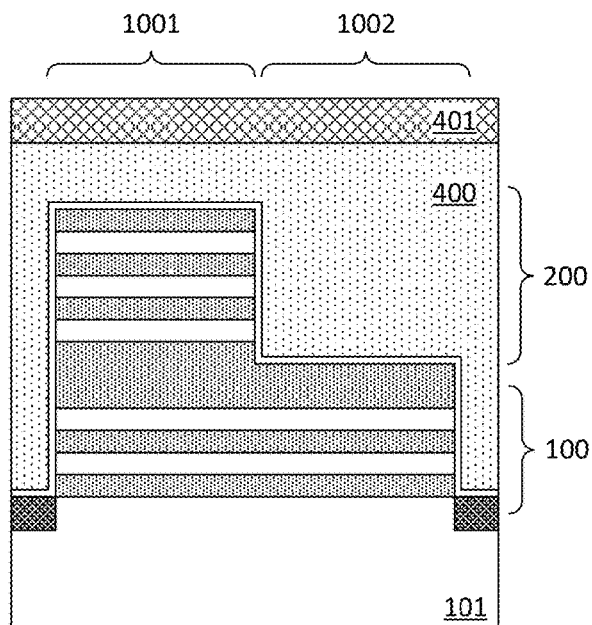
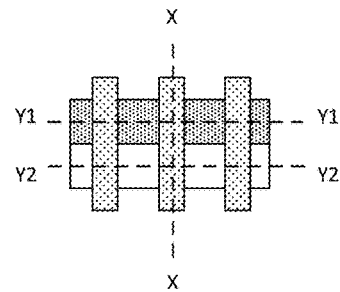
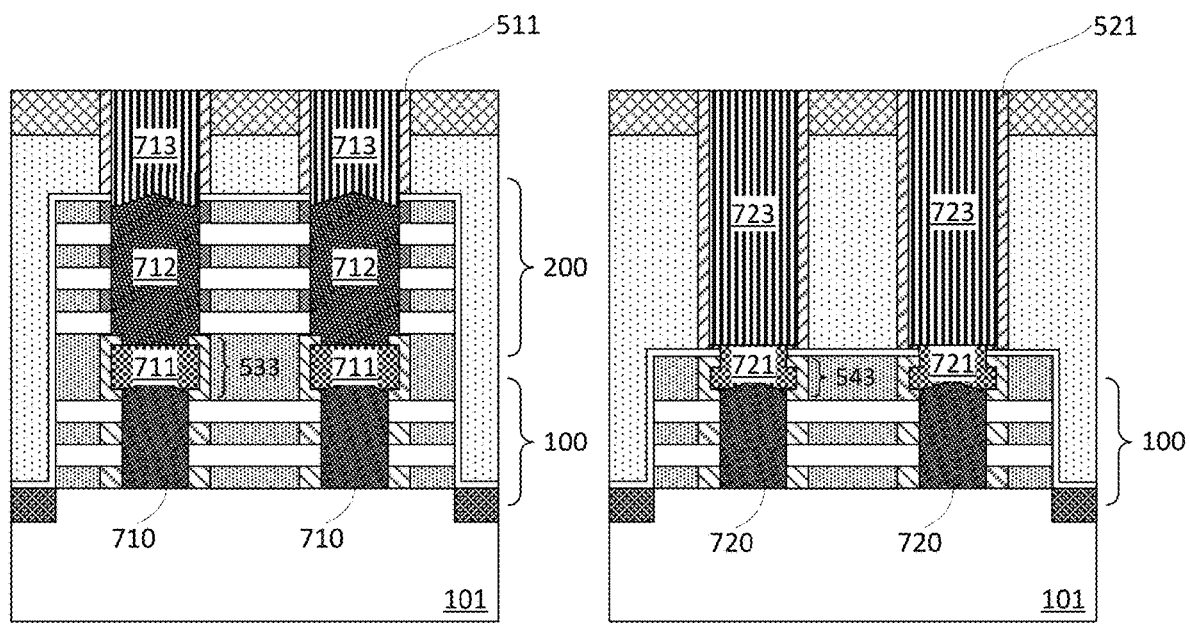
FIG. 12A
FIG. 12B
FIG. 12C

SOURCE/DRAIN EPITAXY PROCESS IN STACKED FET

BACKGROUND

The present application relates to manufacturing of semiconductor integrated circuits. More particularly, it relates to a process of forming epitaxial source/drain regions of stacked field-effect-transistors and a structure formed thereby.

As semiconductor industry moves towards smaller node, for example 7-nm node and beyond, field-effect-transistors (FETs) are aggressively scaled in order to fit into the reduced footprint or real estate, as defined by the node, with increased device density. Among various types of FETs, non-planar FETs such as nanosheet FETs, and particularly stacked nanosheet FETs, are developed to meet this continued device scaling needs.

A nanosheet FET generally has a channel region that includes one or more elongated semiconductor layers in a stacked configuration, wherein each such semiconductor layer is known as a nanosheet layer (or nanosheet channel) and has a width that in general is substantially greater than a thickness of the nanosheet layer. In a nanosheet FET, gate material is generally formed to surround all sides of each of the stacked nanosheet layers, therefore the nanosheet FET may also be referred to as a gate-all-around (GAA) FET or GAA nanosheet FET. Source and drain of the nanosheet FET are formed at the two ends of the nanosheet layers and access to the source and drain are made through metal contacts formed above the source/drain regions.

In a structure where two nanosheet transistors are stacked together, a layer of sacrificial material, which may generally be a same material as that of the sacrificial layers that separate the multiple nanosheets in a nanosheet transistor, may be used in a manufacturing process to separate an uppermost nanosheet of a bottom nanosheet transistor from a lowermost nanosheet of a top nanosheet transistor. During a spacer etch back process, this layer of sacrificial material, which may be for example silicon-germanium (SiGe), may be inadvertently exposed resulting in unwanted epitaxial growth between the bottom and the top nanosheet transistors, resulting in short of the two transistors.

SUMMARY

Embodiments of present invention provide a semiconductor structure. The semiconductor structure includes a first nanosheet transistor having a first set of nanosheets, the first set of nanosheets having an uppermost nanosheet; and a second nanosheet transistor having a second set of nanosheets, the second set of nanosheets having a lowermost nanosheet, wherein the second nanosheet transistor is stacked directly above the first nanosheet transistor and a first end of the lowermost nanosheet of the second nanosheet transistor is vertically separated from a first end of the uppermost nanosheet of the first nanosheet transistor by a first C-shaped spacer.

In one embodiment, the first nanosheet transistor includes inner spacers between the first set of nanosheets, and wherein the inner spacers of the first nanosheet transistor and the first C-shaped spacer are made of a same material.

In another embodiment, the first end of the uppermost nanosheet of the first nanosheet transistor is adjacent to and substantially aligned vertically with a first horizontal portion of the first C-shaped spacer, and the first end of the lowermost nanosheet of the second nanosheet transistor is adjacent to but misaligned vertically with a second horizontal portion of the first C-shaped spacer.

In yet another embodiment, the uppermost nanosheet of the first nanosheet transistor has a first length and the lowermost nanosheet of the second nanosheet transistor has a second length, and the first length of the uppermost nanosheet is longer than the second length of the lowermost nanosheet.

In one embodiment, a source/drain region of the first nanosheet transistor is isolated from a source/drain region of the second nanosheet transistor by a middle-dielectric-isolation (MDI) region. The first nanosheet transistor has a first gate metal and the second nanosheet transistor has a second gate metal and the first gate metal and the second gate metal are connected through a connecting gate contact, wherein a vertical portion of the first C-shaped spacer is directly adjacent to the connecting gate contact.

According to one embodiment, the first nanosheet transistor includes first and second sections and the second nanosheet transistor is stacked directly above the first section. In another embodiment, the second section of the first nanosheet transistor includes a second C-shaped spacer directly above the uppermost nanosheet of the first nanosheet transistor, wherein a vertical portion of the second C-shaped spacer has a height that is lower than a height of a vertical portion of the first C-shaped spacer.

Embodiments of present invention also provide a method of forming a semiconductor structure. The method includes forming a first set of nanosheets and a second set of nanosheets on top of the first set of nanosheets, wherein the first set of nanosheets has an uppermost nanosheet and the second set of nanosheets has a lowermost nanosheet, the lowermost nanosheet being vertically separated from the uppermost nanosheet by a first gap; forming a conformal liner covering the first set of nanosheets and the first gap; covering a first portion of the conformal liner at the first gap with a protective stud; selectively removing a second portion of the conformal liner from end surfaces of the first set of nanosheets; and forming source/drain at the end surfaces of the first set of nanosheets.

In one embodiment, forming the conformal liner includes recessing a sacrificial material between the first set of nanosheets and in the first gap to create indentations between the first set of nanosheets and in the first gap; and forming the conformal liner to form inner spacers between the first set of nanosheets by fully filling the indentations between the first set of nanosheets and form a C-shaped spacer between the uppermost nanosheet and the lowermost nanosheet by partially filling the indentation between the uppermost nanosheet and the lowermost nanosheet.

In another embodiment, the method further includes, before forming the source/drain at the end surfaces of the first set of nanosheets, removing the protective stud to expose the first portion of the conformal liner.

In one embodiment, covering the first portion of the conformal liner includes covering the conformal liner with a protective material and recessing the protective material in an anisotropic etching process to remove the protective material, except a portion thereof that forms the protective stud, from the conformal liner.

In another embodiment, the method further includes removing sacrificial gate materials surrounding the first and second sets of nanosheets with a gate metal in a replacement-metal-gate (RMG) process. In one aspect, the method further includes forming middle-dielectric-isolation (MDI) above the source/drain regions of the first set of nanosheets, wherein the MDI has sidewall surfaces being encapsuled by the first portion of the conformal liner. Additionally, the method further includes forming source/drain regions of the second set of nanosheets, wherein the source/drain regions of the second set of nanosheets are isolated from the source/drain regions of the first set of nanosheets by the MDI.

BRIEF DESCRIPTION OF THE DRAWINGS

The present invention will be understood and appreciated more fully from the following detailed description of embodiments of present invention, taken in conjunction with accompanying drawings of which:

FIGS. 1A, 1B, and 1C are demonstrative illustrations of cross-sectional views of a semiconductor structure in a step of manufacturing thereof according to one embodiment of present invention;

FIGS. 2A, 2B, and 2C are demonstrative illustrations of cross-sectional views of a semiconductor structure in a step of manufacturing thereof, following the step illustrated in FIGS. 1A, 1B, and 1C according to one embodiment of present invention;

FIGS. 3A, 3B, and 3C are demonstrative illustrations of cross-sectional views of a semiconductor structure in a step of manufacturing thereof, following the step illustrated in FIGS. 2A, 2B, and 2C, according to one embodiment of present invention;

FIGS. 7A, 7B, and 7C are demonstrative illustrations of cross-sectional views of a semiconductor structure in a step of manufacturing thereof, following the step illustrated in FIGS. 6A, 6B, and 6C, according to one embodiment of present invention;

FIGS. 8A, 8B, and 8C are demonstrative illustrations of cross-sectional views of a semiconductor structure in a step of manufacturing thereof, following the step illustrated in FIGS. 7A, 7B, and 7C, according to one embodiment of present invention;

FIGS. 10A, 10B, and 10C are demonstrative illustrations of cross-sectional views of a semiconductor structure in a step of manufacturing thereof, following the step illustrated in FIGS. 9A, 9B, and 9C, according to one embodiment of present invention;

FIGS. 11A, 11B, and 11C are demonstrative illustrations of cross-sectional views of a semiconductor structure in a step of manufacturing thereof, following the step illustrated in FIGS. 10A, 10B, and 10C, according to one embodiment of present invention;

FIGS. 12A, 12B, and 12C are demonstrative illustrations of cross-sectional views of a semiconductor structure in a step of manufacturing thereof, following the step illustrated in FIGS. 11A, 11B, and 11C, according to one embodiment of present invention;

Figure 4A:
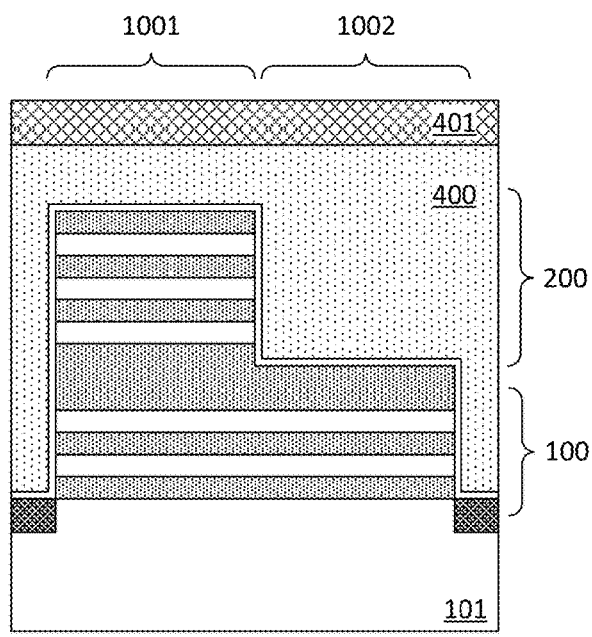
FIGS. 4A, 4B, and 4C are demonstrative illustrations of cross-sectional views of a semiconductor structure in a step of manufacturing thereof, following the step illustrated in FIGS. 3A, 3B, and 3C, according to one embodiment of present invention.
Figure 4A:
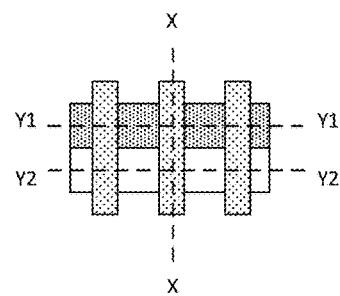

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction"

as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIGS. 1A, 1B, and 1C are demonstrative illustrations of cross-sectional views of a semiconductor structure in a step of manufacturing thereof according to one embodiment of present invention. More specifically, with reference to a simplified illustration of layout at the upper-right corner, FIG. 1A illustrates a cross-sectional view of a nanosheet transistor structure 10 along a dashed line X-X, perpendicular to the nanosheets; FIG. 1B illustrates a cross-sectional view of the nanosheet transistor structure 10 along a dashed line Y1-Y1 parallel to the nanosheets and across the gate; and FIG. 1C illustrates a cross-sectional view of the nanosheet transistor structure 10 along a dashed line Y2-Y2 parallel the dashed line Y1-Y1, that is, parallel to the nanosheets and across the gate. Similarly, FIGS. 2A-2C to FIGS. 13A-13C illustrate cross-sectional reviews of the transistor structure 10, at various manufacturing stages, in a manner similar to FIGS. 1A-1C.

More particularly, embodiments of present invention provide receiving a supporting structure such as, for example, a semiconductor substrate 101, and forming a first nanosheet transistor 100 and a second nanosheet transistor 200 on top of the semiconductor substrate 101. More specifically, embodiments of present invention provide forming a first stack of nanosheets 110 separated by a stack of sacrificial sheets 120 for the first nanosheet transistor 100 and a second stack of nanosheets 210 separated by a stack of sacrificial sheets 220 for the second nanosheet transistor 200. The second stack of nanosheets 210 may be formed on top of the first stack of nanosheets 110 and separated from the first stack of nanosheets 110 by a sacrificial sheet 201. In other words, an uppermost nanosheet of the first stack of nanosheets 110 may be separated from a lowermost nanosheet of the second stack of nanosheets 210 by a first gap that equals to a thickness of the sacrificial sheet 201. In one embodiment, the second stack of nanosheets 210 of the second nanosheet transistor 200 may be formed on top of only a first section 1001 of the first stack of nanosheets 110 of the first nanosheet transistor 100 as is illustrated in FIG. 1B. The second stack of nanosheets 210 of the second nanosheet transistor 200 does not cover a second section 1002 of the first stack of nanosheets 110 of the first nanosheet transistor 100 as is illustrated in FIG. 1C.

In one embodiment, the sacrificial sheet 301 above the second section 1002 of the first stack of nanosheets 110 may have a thickness that is less than, or at most equal to, a thickness of the sacrificial sheet 201 above the first section 1001 of the first stack of nanosheets 110, as is demonstratively illustrated in FIG. 1A. For example, the sacrificial sheet 301 may be a partially etched portion of a sacrificial sheet that forms the sacrificial sheet 201. In one embodiment, one or more of the first and second stacks of nanosheets 110 and 210 may be silicon (Si) nanosheets or silicon-germanium (SiGe) nanosheets with a first germanium (Ge) concentration, and one or more of the sacrificial sheets 120 and 220 may be SiGe nanosheets with a second Ge concentration. The second Ge concentration of the sacrificial sheets 120 and 220 may be different from the first Ge concentration of the first and second stacks of nanosheets 110 and 210 such that they may, for example, have different etch selectivity. In general, the individual nanosheets of the first and second stacks of nanosheets 110 and 210 may have a thickness ranging from about 5 nm to about 30 nm, and the sacrificial sheets 120 and 220 may have a thickness ranging from about 5 nm to about 30 nm.

Embodiments of present invention further provide forming a dummy gate 400 on top of the first and second stacks of nanosheets 110 and 210. The dummy gate 400 may be patterned, using a hard mask 401 in a lithographic patterning and etching process, to have openings 410 above the second stack of nanosheets 210 and openings 420 above the second section 1002 of the first stack of nanosheets 110. The openings 410 and 420 may be used in a subsequent processing step, as being described below in more details, in forming source/drain regions of the first and second nanosheet transistors 100 and 200.

FIGS. 2A, 2B, and 2C are demonstrative illustrations of cross-sectional views of a semiconductor structure in a step of manufacturing thereof, following the step illustrated in FIGS. 1A, 1B, and 1C according to one embodiment of present invention. More particularly, embodiments of present invention provide forming sidewall spacers 511 at the sidewalls of the openings 410. Using the sidewall spacers 511 together and the hard mask 401 as an etch mask, embodiments of present invention provide etching the second stack of nanosheets 210 into a second set of nanosheets 211. The etching stops at the sacrificial sheet 201 below the lowermost nanosheet of the second stack of nanosheets 210 but above the uppermost nanosheet of the first stack of nanosheets 110. After forming the second set of nanosheets 211, embodiments of present invention provide forming indentations of the sacrificial sheets between the second set of nanosheets 211 and subsequently filling the spaces created by the indentation with a conformal dielectric layer 512 to form inner spacers.

While the second section 1002 of the first stack of nanosheets 110 is not etched at this stage through the openings 420, embodiments of present invention provide forming sidewall spacers 521 at the sidewalls of the openings 420 above the second section of the first stack of nanosheets 110 and subsequently forming a conformal dielectric layer 522 lining the openings 420.

FIGS. 3A, 3B, and 3C are demonstrative illustrations of cross-sectional views of a semiconductor structure in a step of manufacturing thereof, following the step illustrated in FIGS. 2A, 2B, and 2C, according to one embodiment of present invention. More particularly, embodiments of present invention provide using the conformal dielectric layers 512 and 522 as etch masks, after selectively removing a horizontal portion thereof directly above the sacrificial sheets 201 and 301, to etch the first stack of nanosheets 110 into a first set of nanosheets 111.

In one embodiment, the first set of nanosheets 111 may be longer than the second set of nanosheets 211. This is because of the use of the conformal dielectric layer 512 as an etch mask. For example, the uppermost nanosheet of the first set of nanosheets 111 may have a first length and the lowermost nanosheet of the second set of nanosheets 211 may have a second length and the first length is longer than the second length. In one embodiment, the first length is longer than the second length by twice a thickness of the conformal dielectric layer 512, in view that the conformal dielectric layer 512 is formed at the two end surfaces of the second set of nanosheets 211 as is illustrated in FIG. 3B. The uppermost nanosheet and the lowermost nanosheet may be vertically separated by a sacrificial sheet 202, which is formed from etching the sacrificial sheet 201 and after a subsequent recessing process, as being described below in more details.

Embodiments of present invention further provide recessing the sacrificial sheets between the first set of nanosheets 111 to form a stack of sacrificial sheets 121 with indentations. The recessing also transforms the sacrificial sheet 201 into the sacrificial sheet 202 with indentations between the uppermost nanosheet of the first set of nanosheets 111 and the lowermost nanosheet of the second set of nanosheets 211. In one embodiment, the sacrificial sheets 121 and sacrificial sheet 202 may be made of a same material such as, for example, silicon-germanium (SiGe) and thus may be made to have similar depths of indentations. The recessing also transforms the sacrificial sheet 301 into a sacrificial sheet 302, with indentations, directly above the second section 1002 of the first set of nanosheets 111. The sacrificial sheet 301 (and thus sacrificial sheet 302) has a thickness that is formed to be at most equal to and generally less the thickness of the sacrificial sheet 202.

Figure 4B:
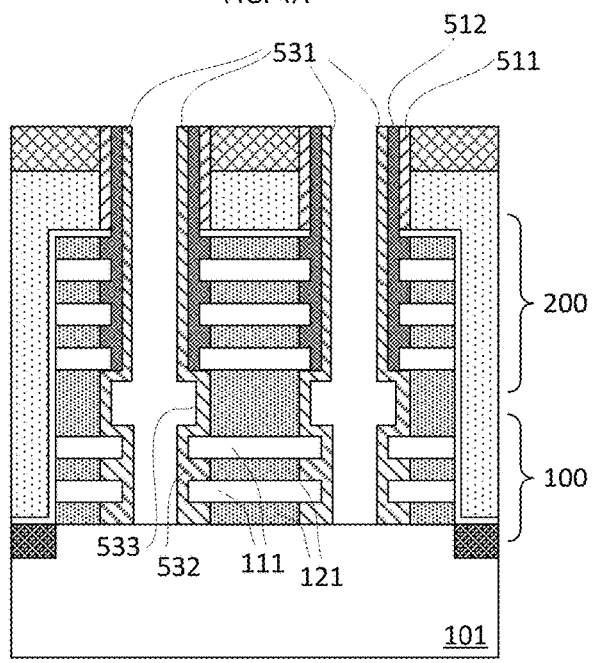
Figure 4C:
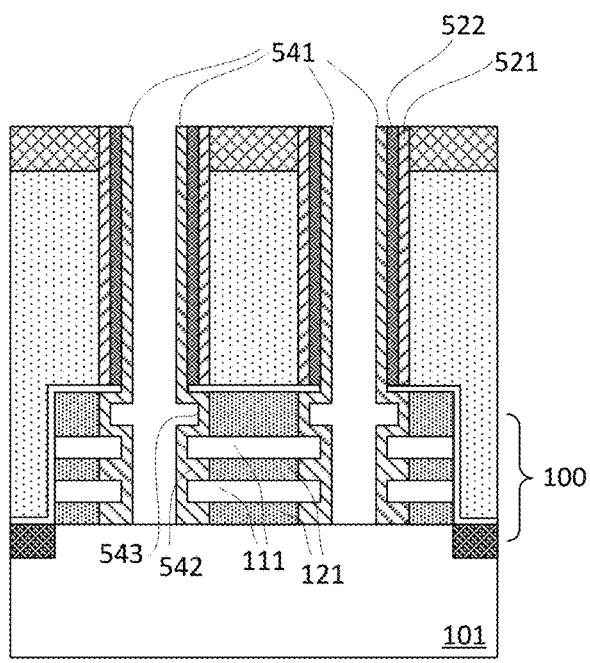

FIGS. 4A, 4B, and 4C are demonstrative illustrations of cross-sectional views of a semiconductor structure in a step of manufacturing thereof, following the step illustrated in FIGS. 3A, 3B, and 3C, according to one embodiment of present invention. More particularly, embodiments of present invention provide depositing a conformal liner such as a conformal dielectric layer 531 filling the indentations between the first set of nanosheets 111 and between the uppermost nanosheet of the first set of nanosheets 111 and the lowermost nanosheet of the second set of nanosheets 211, i.e., at the end surface of the sacrificial sheet 202. In one embodiment, the conformal liner or conformal dielectric layer 531 may have a thickness that is approximately half of a distance or gap between two neighboring nanosheets of the first set of nanosheets 111 such that the conformal liner or conformal dielectric layer 531 may fully or completely fill the indentations between the first set of nanosheets 111 to form inner spacers 532. Hereinafter, the conformal liner or conformal dielectric layer 531 may be simply referred to as the conformal dielectric layer 531.

In another embodiment, the first gap between the uppermost nanosheet of the first set of nanosheets 111 and the lowermost nanosheet of the second set of nanosheets 211 may be larger than the distance or gap between two neighboring nanosheets of the first set of nanosheets 111. In other words, a thickness of the sacrificial sheet 202 may be thicker than a thickness of the sacrificial sheets 121 between the first set of nanosheets 111. Accordingly, the conformal dielectric layer 531 may not fully or completely fill the indentation between the uppermost nanosheet of the first set of nanosheets 111 and the lowermost nanosheet of the second set of nanosheets 211. As a result, the conformal dielectric layer 531 may form a C-shaped spacer 533 at the end surfaces of the sacrificial sheet 202 and between the uppermost nanosheet of the first set of nanosheets 111 and the lowermost nanosheet of the second set of nanosheets 211.

The inner spacers 532 and the C-shaped spacer 533 may be made of a same material, i.e., from the same material of the conformal dielectric layer 531. The conformal dielectric layer 531 may be, for example, silicon-oxide (SiOx), silicon-nitride (SiN), silicon-oxycarbonitride (SiOCN), and silicon-boroncarbonitride (SiBCN), or other suitable materials.

Similarly, embodiments of present invention provide depositing a conformal liner or conformal dielectric layer 541 filling the indentations between the first set of nanosheets 111 in the second section 1002. The conformal dielectric layer 541 may be the same as the conformal dielectric layer 531 and may fully or completely fill the indentations between the first set of nanosheets 111, in the second section 1002, to form inner spacers 542. The conformal dielectric layer 541 may also form a C-shaped spacer 543 at the end surfaces of the sacrificial sheet 302 above the first set of nanosheets 111, at the second section 1002 thereof. In one embodiment, a vertical portion of the C-shaped spacer 543 has a height that is lower than a height of a vertical portion of the C-shaped spacer 533 between the first nanosheet transistor 100 and the second nanosheet transistor 200 and more particularly between the uppermost nanosheet of the first set of nanosheets 111 and the lowermost nanosheet of the second set of nanosheets 211.

Figure 5A:
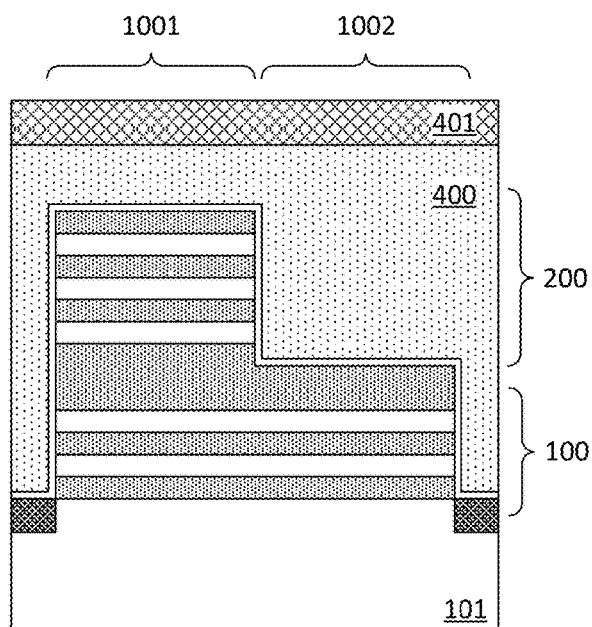
FIGS. 5A, 5B, and 5C are demonstrative illustrations of cross-sectional views of a semiconductor structure in a step of manufacturing thereof, following the step illustrated in FIGS. 4A, 4B, and 4C, according to one embodiment of present invention.
Figure 5B:
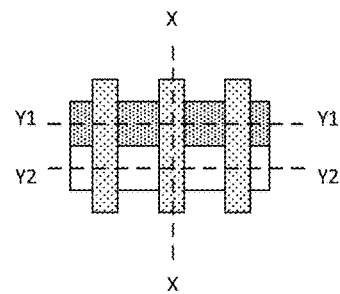
Figure 5B:
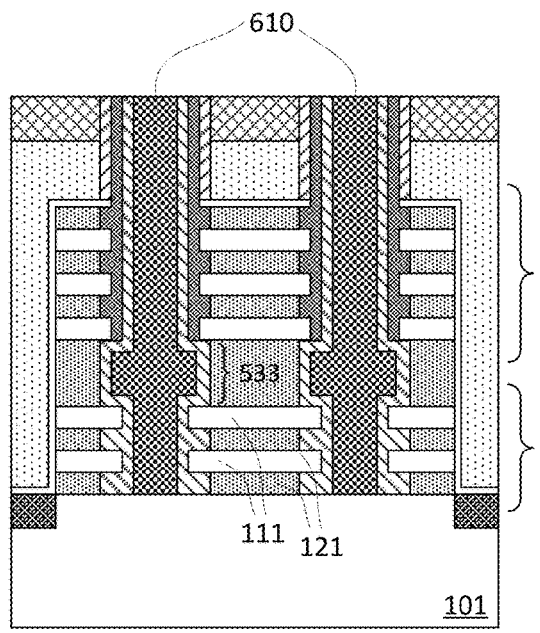
Figure 5C:
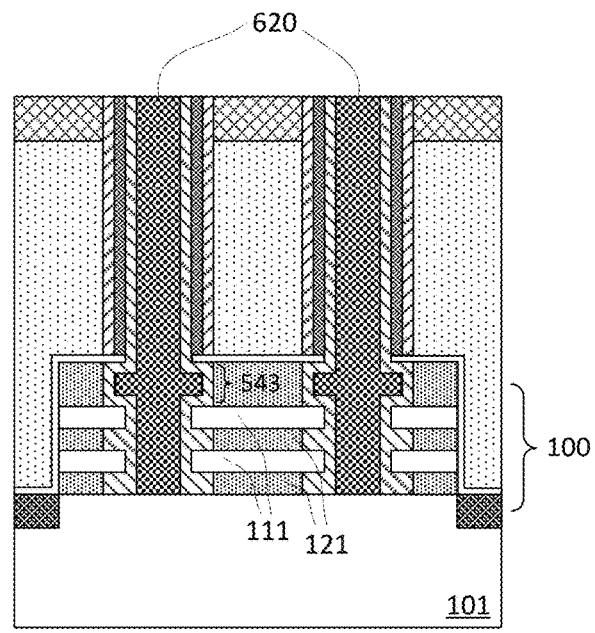

FIGS. 5A, 5B, and 5C are demonstrative illustrations of cross-sectional views of a semiconductor structure in a step of manufacturing thereof, following the step illustrated in FIGS. 4A, 4B, and 4C, according to one embodiment of present invention. More particularly, embodiments of present invention provide filling the openings 410 between the conformal dielectric layers 531 and the openings 420 between the conformal dielectric layers 541 with a sacrificial material such as, for example, amorphous silicon (aSi), amorphous carbon (aC) or titanium-oxide (TiO). A chemical-mechanic-polishing (CMP) process may be used to remove excessive portions of the sacrificial material layers 610 and 620 to create a planar top surface. The sacrificial material layers 610 and 620 between the conformal dielectric layers 531 and between the conformal dielectric layers 541 may be deposited in order to form protective studs 612 and 622 protecting the C-shaped spacers 533 and 543, as being described below in more details with reference to FIGS. 7A-7C.

Figure 6A:
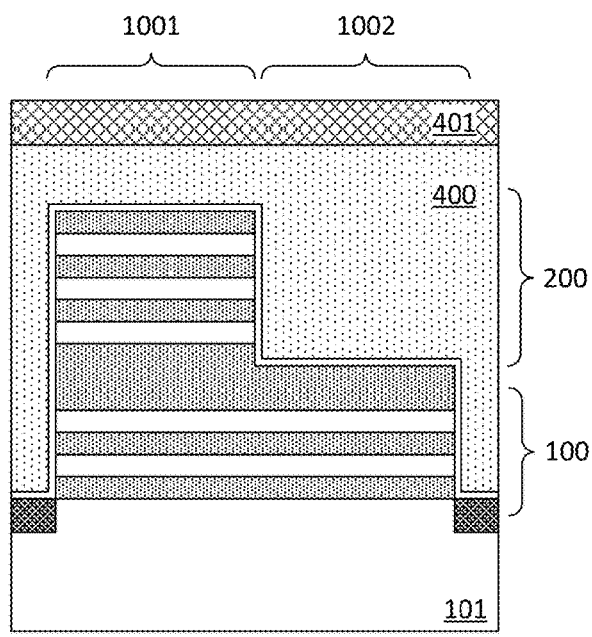
FIGS. 6A, 6B, and 6C are demonstrative illustrations of cross-sectional views of a semiconductor structure in a step of manufacturing thereof, following the step illustrated in FIGS. 5A, 5B, and 5C, according to one embodiment of present invention.
Figure 6B:
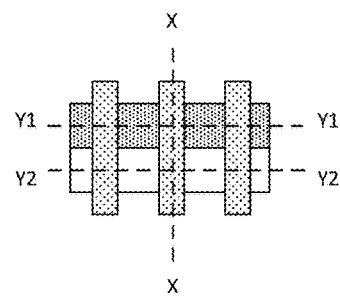
Figure 6B:
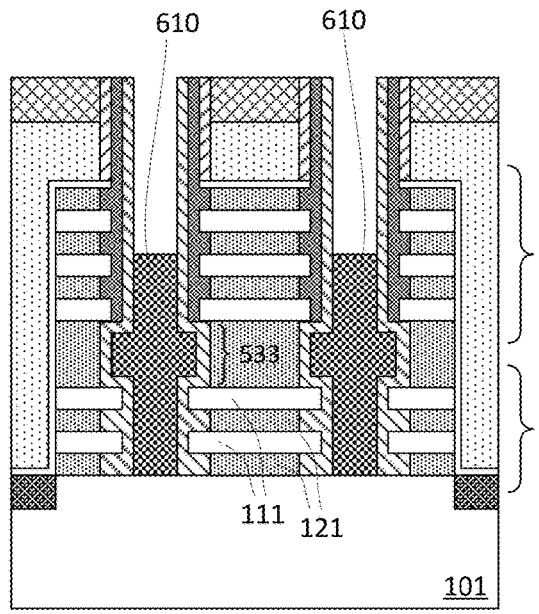
Figure 6C:
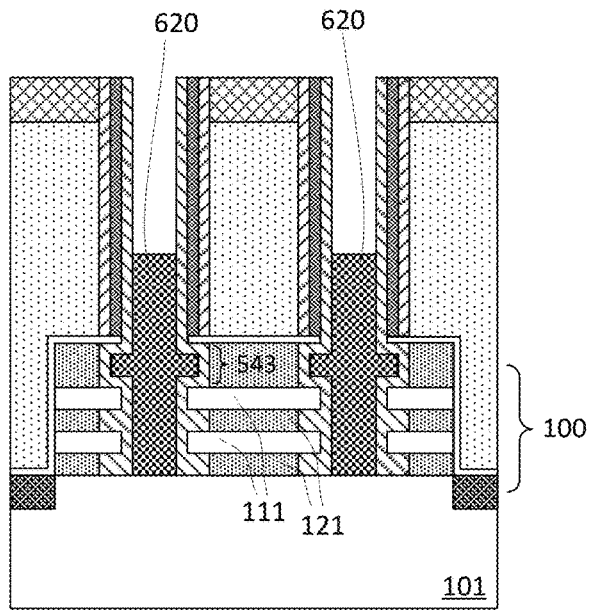

FIGS. 6A, 6B, and 6C are demonstrative illustrations of cross-sectional views of a semiconductor structure in a step of manufacturing thereof, following the step illustrated in FIGS. 5A, 5B, and 5C, according to one embodiment of present invention. More particularly, embodiments of present invention provide, optionally, applying a wet etching process to recess the sacrificial material layers 610 and 620 to be below a top surface of the hard masks 401. The recessing may be performed by selectively etching the sacrificial material layers 610 and 620 and may stop before a top level of the sacrificial material layers 610 and 620 reaches the lowermost nanosheet of the second set of nanosheets 211 or reaches the C-shaped spacers 533 and 543.

FIGS. 7A, 7B, and 7C are demonstrative illustrations of cross-sectional views of a semiconductor structure in a step of manufacturing thereof, following the step illustrated in FIGS. 6A, 6B, and 6C, according to one embodiment of present invention. More particularly, embodiments of present invention provide selectively and directionally etching the sacrificial material layers 610 and 620 between the conformal dielectric layers 531 and between the conformal dielectric layers 541 through, for example, a reactive-ion-etching (RIE) process. The etching process may remove most of the sacrificial material layers 610 and 620, leaving only portions thereof that are directly adjacent to the C-shaped spacers 533 and 543 to form protective studs 612 and 622. For example, the protective stud 612 may cover the C-shaped spacer 533 and may be coplanar with the vertical portion of the conformal dielectric layer 531. Similarly, the protective stud 622 may cover the C-shaped spacer 543 and may be coplanar with the vertical portion of the conformal dielectric layer 541.

FIGS. 8A, 8B, and 8C are demonstrative illustrations of cross-sectional views of a semiconductor structure in a step of manufacturing thereof, following the step illustrated in FIGS. 7A, 7B, and 7C, according to one embodiment of present invention. More particularly, embodiments of present invention provide removing the conformal dielectric layers 531 and 541 in an isotropic etching process to expose end surfaces of the first set of nanosheets 111. More particularly, with the protective studs 612 and 622 protecting the C-shaped spacers 533 and 543, the isotropic etching process removes only portions of the conformal dielectric layers 531 and 541 at the end surfaces of the first set of nanosheets 111, thereby source/drain regions for the first nanosheet transistor 100 may be subsequently formed as being described below in more details.

Figure 9A:
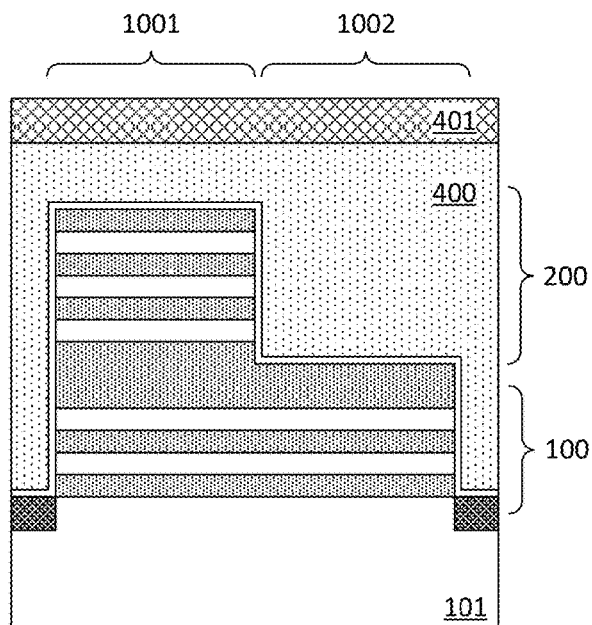
FIGS. 9A, 9B, and 9C are demonstrative illustrations of cross-sectional views of a semiconductor structure in a step of manufacturing thereof, following the step illustrated in FIGS. 8A, 8B, and 8C, according to one embodiment of present invention.
Figure 9A:
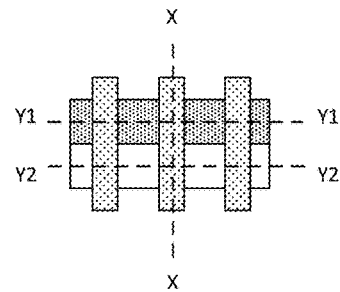
Figure 9B:
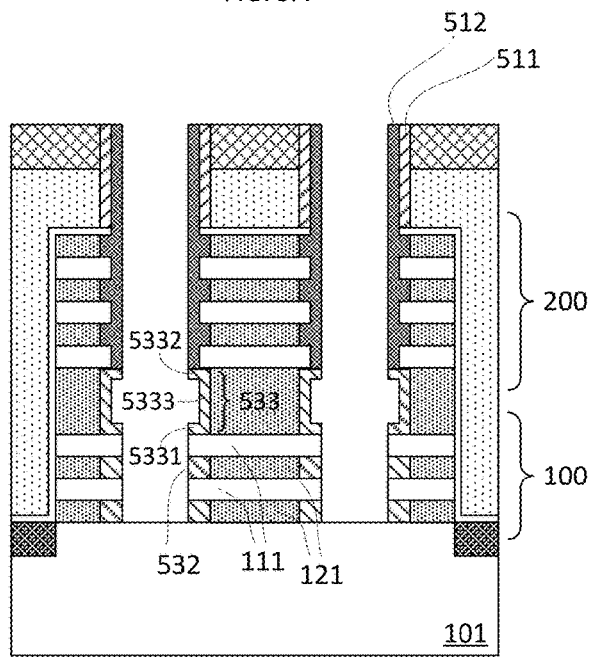
Figure 9C:
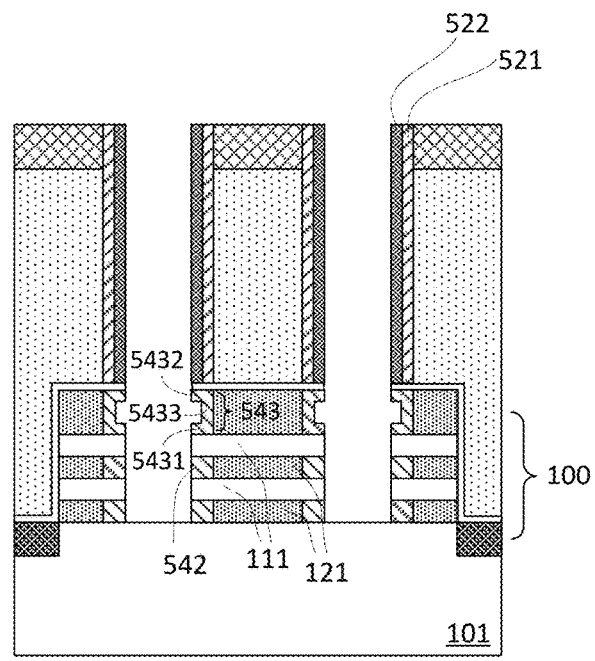

FIGS. 9A, 9B, and 9C are demonstrative illustrations of cross-sectional views of a semiconductor structure in a step of manufacturing thereof, following the step illustrated in FIGS. 8A, 8B, and 8C, according to one embodiment of present invention. More particularly, embodiments of present invention provide removing the protective studs 612 and 622 to expose the C-shaped spacers 533 and 543. The C-shaped spacers 533 and 543 protect the end surfaces of sacrificial sheets 202 and 302 which may be, for example, SiGe. The C-shaped spacers 533 prevent any epitaxial growth of source/drain material at the end surfaces of the sacrificial sheet 202, which would otherwise short the source/drain regions of the first and second nanosheet transistors 100 and 200.

In one embodiment, an end of the uppermost nanosheet of the first set of nanosheets 111 of the first nanosheet transistor 100 is adjacent to and substantially aligned vertically with a lower horizontal portion 5331 of the C-shaped spacer 533, and an end of the lowermost nanosheet of the second set of nanosheets 211 of the second nanosheet transistor 200 is adjacent to but misaligned vertically with an upper horizontal portion 5332 of the C-shaped spacer 533, as being demonstratively illustrated in FIG. 9B. Similarly, an end of the uppermost nanosheet of the first set of nanosheets 111, at the second section thereof, is adjacent to and substantially aligned vertically with a lower horizontal portion 5431 of the C-shaped spacer 543. An upper horizontal portion 5432 of the C-shaped spacer 543 is vertically and substantially aligned with the lower horizontal portion 5431 of the C-shaped spacer 543 and substantially aligned vertically with the conformal dielectric layer 522. In one embodiment, a vertical portion 5433 of the C-shaped spacer 543 has a height that is lower than a vertical portion 5333 of the C-shaped spacer 533. The C-shaped spacer 533 may be a first C-shaped spacer and the C-shaped spacer 543 may be a second C-shaped spacer.

FIGS. 10A, 10B, and 10C are demonstrative illustrations of cross-sectional views of a semiconductor structure in a step of manufacturing thereof, following the step illustrated in FIGS. 9A, 9B, and 9C, according to one embodiment of present invention. More particularly, embodiments of present invention provide epitaxially growing source/drain regions 710 and 720 at the end surfaces of the first set of nanosheets 111. Since the end surfaces of the sacrificial sheets 202 and 302 are covered by the C-shaped spacers 533 and 543, which are dielectric materials, there will be no epitaxial growth of source/drain materials either at the C-shaped spacers 533 and 543 or at the end surfaces of the sacrificial sheets 202 and 302. Similarly, the conformal dielectric layer 512 covers the end surfaces of the second set of nanosheets 211, there will be no epitaxial growth of source/drain materials for the second nanosheet transistor 200.

FIGS. 11A, 11B, and 11C are demonstrative illustrations of cross-sectional views of a semiconductor structure in a step of manufacturing thereof, following the step illustrated in FIGS. 10A, 10B, and 10C, according to one embodiment of present invention. More particularly, embodiments of present invention provide depositing, on top of the source/drain regions 710 and 720 of the first nanosheet transistor 100, middle-dielectric-isolation (MDI) layers 711 and 721 respectively. The MDI layers 711 and 721 may be deposited to have a height within the C-shaped spacers 533 or may be initially deposited to have a height higher than the C-shaped spacers 533 and subsequently be recessed down to below the second set of nanosheets 211 of the second nanosheet transistor 200 so as not to obscure the formation of source/drain regions of the second nanosheet transistor 200 as being described below in more details. The MDI layers 711 have sidewall surfaces that are directly adjacent to the C-shaped spacers 533, and thus encapsuled by the C-shaped spacers 533, as being demonstratively illustrated in FIG. 11B. The MDI layers 711 and 721 may be SiN, SiO, or other suitable materials and may be deposited through, for example, a CVD process, an ALD process, or other currently available or future developed means.

FIGS. 12A, 12B, and 12C are demonstrative illustrations of cross-sectional views of a semiconductor structure in a step of manufacturing thereof, following the step illustrated in FIGS. 11A, 11B, and 11C, according to one embodiment of present invention. More particularly, embodiments of present invention provide forming source/drain regions for the second nanosheet transistor 200. In doing so, embodiments of present invention provide first removing, for example through an isotropic etching process, a first portion of the conformal dielectric layer 512 that covers the end surfaces of the second set of nanosheets 211. The etching process stops when the end surfaces of the second set of nanosheets 211 are exposed and leave a second portion of the conformal dielectric layer 512 in between the second set of nanosheets as inner spacers. Embodiments of present invention further provide forming epitaxial source/drain regions 712, such as SiGe, at the end surfaces of the second set of nanosheets 211 for the second nanosheet transistor 200. The epitaxial source/drain regions 710 of the first nanosheet transistor 100 are isolated from the epitaxial source/drain regions 712 of the second nanosheet transistor 200 by the MDI layers 711. Contact metals 713 may subsequently be deposited on top of the source/drain regions 712. On the other hand, in the second section 1002 of the first nanosheet transistor 100, there is no stacked nanosheet transistor on top of the first nanosheet transistor 100 and a filler material 723, which may be a same material as the contact metal 713 although not necessarily, may be deposited on top of the MDI 721 after the conformal dielectric layer 522 is removed. The conformal dielectric layer 522 may be removed during the process of removing the conformal dielectric layer 512 in forming source/drain regions 712 of the second nanosheet transistor 200.

Figure 13A:
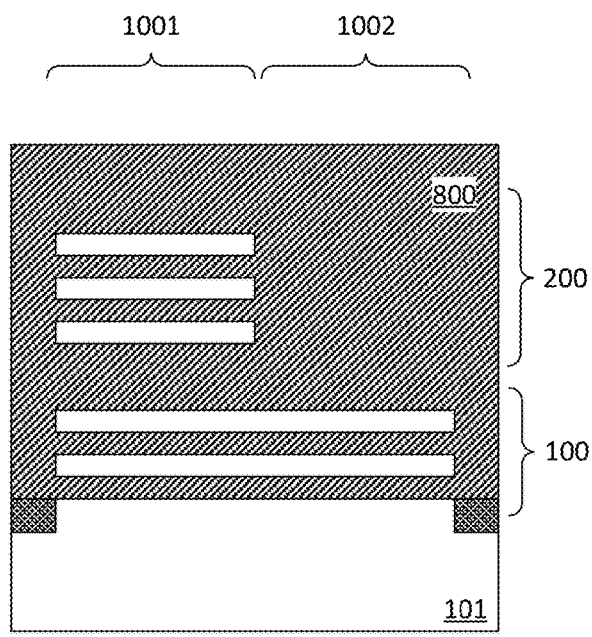
FIGS. 13A, 13B, and 13C are demonstrative illustrations of cross-sectional views of a semiconductor structure in a step of manufacturing thereof, following the step illustrated in FIGS. 12A, 12B, and 12C, according to one embodiment of present invention.
Figure 13B:
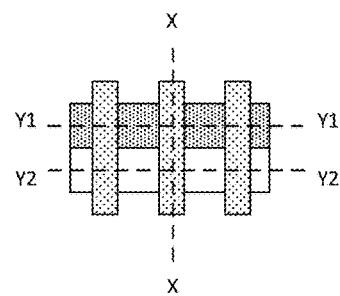
Figure 13B:
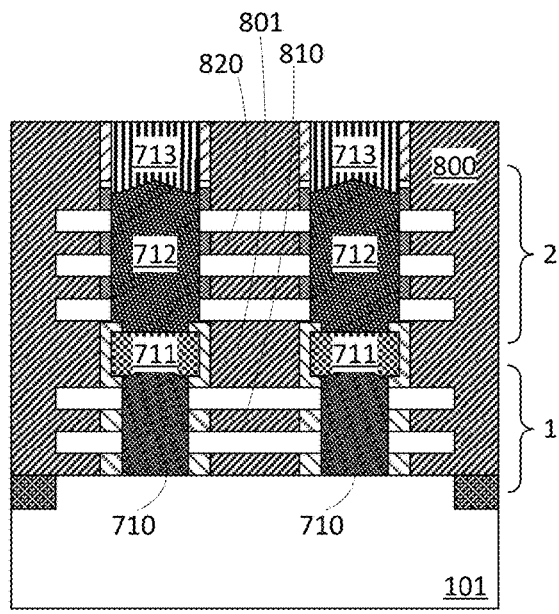
Figure 13C:
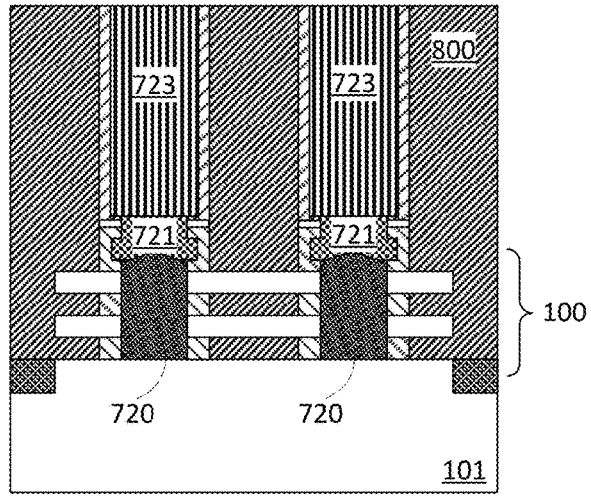

FIGS. 13A, 13B, and 13C are demonstrative illustrations of cross-sectional views of a semiconductor structure in a step of manufacturing thereof, following the step illustrated in FIGS. 12A, 12B, and 12C, according to one embodiment of present invention. More particularly, embodiments of present invention provide performing a replacement-metal-gate (RMG) process. The RMG process removes the sacrificial sheets 121 between the first set of nanosheets 111, the sacrificial sheets 221 between the second set of nanosheets 211, and the dummy gate 400 and replaces them with a gate metal 800. In other words, the first nanosheet transistor 100 may have a first gate metal 810, the second nanosheet transistor 200 may have a second gate metal 820, and the first gate metal 810 and the second gate metal 820 are connected through or share a connecting gate contact 801. As being demonstratively illustrated in FIG. 13B, the first gate metal 810, the second gate metal 820, and the connecting gate contact 801 share the same gate metal 800. The vertical portion 5333 of the C-shaped spacer 533 may be directly adjacent to the connecting gate contact 801.

The gate metal 800 may include one or more workfunction metals surrounding the nanosheets of the first and second nanosheet transistors 100 and 200. The gate metals 810, 820 and the connecting gate contact 801 may be tungsten (W), copper (Cu), ruthenium (Ru), and/or other suitable conductive materials.

Figure 14:
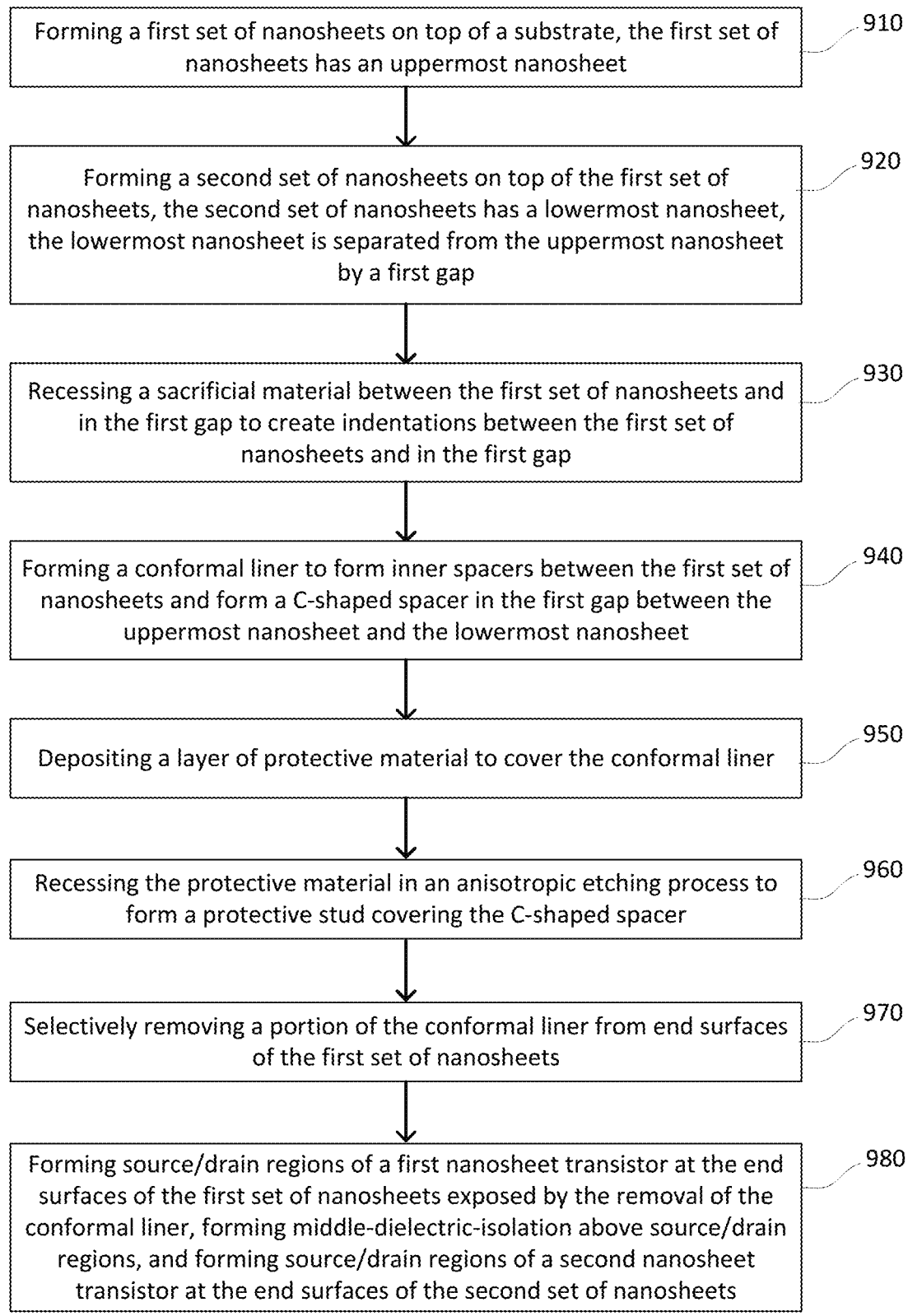
FIG. 14 is a demonstrative illustration of a flow-chart of a method of manufacturing a semiconductor structure according to embodiments of present invention.

FIG. 14 is a demonstrative illustration of a flow-chart of a method of manufacturing a semiconductor structure according to embodiments of present invention. The method includes (910) forming a first set of nanosheets on top of a supporting structure such as a substrate, wherein the first set of nanosheets has an uppermost nanosheet; (920) forming a second set of nanosheets on top of the first set of nanosheets, wherein the second set of nanosheets has a lowermost nanosheet and the lowermost nanosheet is separated from the uppermost nanosheet of the first set of nanosheets by a first gap; (930) recessing a sacrificial material between the first set of nanosheets and in the first gap to create indentations between the first set of nanosheets and in the first gap; (940) forming a conformal liner to form inner spacers between the first set of nanosheets and form a C-shaped spacer in the first gap between the uppermost nanosheet and the lowermost nanosheet; (950) depositing a layer of protective material to cover the conformal liner; (960) recessing the protective material layer in an anisotropic etching process to form a protective stud that covers the C-shaped spacer in the first gap; (970) selectively removing a portion of the conformal liner from end surfaces of the first set of nanosheets; and (980) forming source/drain regions of a first nanosheet transistor at the end surfaces of the first set of nanosheets that are exposed by the removal of the conformal liner, forming middle-dielectric-isolation (MDI) above the source/drain regions, and forming source/drain regions of a second nanosheet transistor at the end surfaces of the second set of nanosheets.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:
    a first nanosheet transistor having a first set of nanosheets, the first set of nanosheets having an uppermost nanosheet; and
    a second nanosheet transistor having a second set of nanosheets, the second set of nanosheets having a lowermost nanosheet,
    wherein the second nanosheet transistor is stacked directly above the first nanosheet transistor and a first end of the lowermost nanosheet of the second nanosheet transistor is vertically separated from a first end of the uppermost nanosheet of the first nanosheet transistor by a first C-shaped spacer.

2. The semiconductor structure of claim 1, wherein the first nanosheet transistor comprises inner spacers between the first set of nanosheets, and wherein the inner spacers of the first nanosheet transistor and the first C-shaped spacer are made of a same material.

3. The semiconductor structure of claim 1, wherein the first end of the uppermost nanosheet of the first nanosheet transistor is adjacent to and substantially aligned vertically with a first horizontal portion of the first C-shaped spacer, and the first end of the lowermost nanosheet of the second nanosheet transistor is adjacent to but misaligned vertically with a second horizontal portion of the first C-shaped spacer.

4. The semiconductor structure of claim 1, wherein the uppermost nanosheet of the first nanosheet transistor has a first length and the lowermost nanosheet of the second nanosheet transistor has a second length, and the first length of the uppermost nanosheet is longer than the second length of the lowermost nanosheet.

5. The semiconductor structure of claim 1, wherein a source/drain region of the first nanosheet transistor is isolated from a source/drain region of the second nanosheet transistor by a middle-dielectric-isolation (MDI) region.

6. The semiconductor structure of claim 1, wherein the first nanosheet transistor has a first gate metal and the second nanosheet transistor has a second gate metal and the first gate metal and the second gate metal are connected through a connecting gate contact, wherein a vertical portion of the first C-shaped spacer is directly adjacent to the connecting gate contact.

7. The semiconductor structure of claim 1, wherein the first nanosheet transistor comprises a first and second sections and the second nanosheet transistor is stacked directly above the first section of the first nanosheet transistor, the second section of the first nanosheet transistor comprises a second C-shaped spacer directly above the uppermost nanosheet of the first nanosheet transistor, wherein a vertical portion of the second C-shaped spacer has a height that is lower than a height of a vertical portion of the first C-shaped spacer.

8. A semiconductor structure comprising:
a first nanosheet transistor having an uppermost nanosheet; and
a second nanosheet transistor having a lowermost nanosheet,
wherein the second nanosheet transistor is stacked directly above the first nanosheet transistor and a first end of the lowermost nanosheet of the second nanosheet transistor and a first end of the uppermost nanosheet of the first nanosheet transistor are directly adjacent to a first C-shaped spacer, and wherein a length of the uppermost nanosheet of the first nanosheet transistor is longer than a length of the lowermost nanosheet of the second nanosheet transistor.

9. The semiconductor structure of claim 8, wherein the first nanosheet transistor comprises inner spacers between a first set of nanosheets, the first set of nanosheets including the uppermost nanosheet, and wherein the inner spacers of the first nanosheet transistor and the first C-shaped spacer are made of a same material.

10. The semiconductor structure of claim 8, wherein the first end of the uppermost nanosheet of the first nanosheet transistor is substantially aligned vertically with a first horizontal portion of the first C-shaped spacer, and the first end of the lowermost nanosheet of the second nanosheet transistor is misaligned vertically with a second horizontal portion of the first C-shaped spacer.

11. The semiconductor structure of claim 8, wherein a source/drain region of the first nanosheet transistor is isolated from a source/drain region of the second nanosheet transistor by a middle-dielectric-isolation (MDI) region.

12. The semiconductor structure of claim 8, wherein the first nanosheet transistor has a first gate metal and the second nanosheet transistor has a second gate metal and the first gate metal and the second gate metal are connected through a connecting gate contact, wherein a vertical portion of the first C-shaped spacer is directly adjacent to the connecting gate contact.

13. The semiconductor structure of claim 8, further comprising a second C-shaped spacer directly above the uppermost nanosheet of the first nanosheet transistor in a section of the first nanosheet transistor not covered by the second nanosheet transistor, wherein a vertical portion of the second C-shaped spacer has a height that is lower than a height of a vertical portion of the first C-shaped spacer.

14. A method of forming a semiconductor structure comprising:
forming a first set of nanosheets and a second set of nanosheets on top of the first set of nanosheets, wherein the first set of nanosheets has an uppermost nanosheet and the second set of nanosheets has a lowermost nanosheet, the lowermost nanosheet being vertically separated from the uppermost nanosheet by a first gap;
forming a conformal liner covering the first set of nanosheets and the first gap;
covering a first portion of the conformal liner at the first gap with a protective stud;
selectively removing a second portion of the conformal liner from end surfaces of the first set of nanosheets; and
forming source/drain regions at the end surfaces of the first set of nanosheets.

15. The method of claim 14, wherein forming the conformal liner comprises:
recessing a sacrificial material between the first set of nanosheets and in the first gap to create indentations between the first set of nanosheets and in the first gap; and
forming the conformal liner to form inner spacers between the first set of nanosheets by fully filling the indentations between the first set of nanosheets and form a C-shaped spacer between the uppermost nanosheet and the lowermost nanosheet by partially filling the indentation between the uppermost nanosheet and the lowermost nanosheet.

16. The method of claim 15, further comprising, before forming the source/drain at the end surfaces of the first set of nanosheets, removing the protective stud to expose the first portion of the conformal liner.

17. The method of claim 14, wherein covering the first portion of the conformal liner comprises covering the conformal liner with a protective material and recessing the protective material in an anisotropic etching process to remove the protective material, except a portion thereof that forms the protective stud, from the conformal liner.

18. The method of claim 14, further comprising removing sacrificial gate materials surrounding the first and second sets of nanosheets with a gate metal in a replacement-metal-gate (RMG) process.

19. The method of claim 14, further comprising forming middle-dielectric-isolation (MDI) above the source/drain regions of the first set of nanosheets, wherein the MDI has sidewall surfaces being encapsuled by the first portion of the conformal liner.

20. The method of claim 19, further comprising forming source/drain regions of the second set of nanosheets, wherein the source/drain regions of the second set of nanosheets are isolated from the source/drain regions of the first set of nanosheets by the MDI.

* * * * *